(12) United States Patent
Ahrens et al.

(10) Patent No.: US 7,290,945 B2
(45) Date of Patent: Nov. 6, 2007

(54) ELECTROMAGNETIC INDUCTIVE SHIELD

(75) Inventors: Michael E. Ahrens, San Jose, CA (US); Roger Viet, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/322,437

(22) Filed: Dec. 29, 2005

(65) Prior Publication Data

US 2007/0154149 A1   Jul. 5, 2007

(51) Int. Cl.
*G02B 6/36* (2006.01)
*H01R 13/648* (2006.01)
*H04B 10/00* (2006.01)

(52) U.S. Cl. .............................. 385/92; 385/88; 385/94; 385/53; 385/76; 385/139; 385/101; 439/497; 439/577; 439/607; 439/608; 398/135; 398/139

(58) Field of Classification Search .................. 385/53, 385/56, 58, 59, 60, 70, 72, 76, 77, 78, 88, 385/92, 94, 139, 101; 398/135, 139; 439/497, 439/577, 607, 608, 610

See application file for complete search history.

(56) References Cited

U.S. PATENT DOCUMENTS

| 6,335,869 | B1 * | 1/2002 | Branch et al. .............. 361/816 |
| 6,416,361 | B1 * | 7/2002 | Hwang ........................ 439/607 |
| 6,540,555 | B1 * | 4/2003 | Festag et al. ................ 439/607 |
| 6,848,943 | B2 * | 2/2005 | Machado et al. ............ 439/607 |
| 6,860,641 | B1 * | 3/2005 | Goldenburg et al. ........... 385/53 |
| 2003/0152331 | A1 * | 8/2003 | Dair et al. ..................... 385/59 |

* cited by examiner

*Primary Examiner*—Brian M. Healy
(74) *Attorney, Agent, or Firm*—Blakely, Sokoloff, Taylor & Zafman LLP

(57) ABSTRACT

According to one embodiment of the invention, a system comprising a housing including an opening to receive an optical connector, and an electromagnetic inductive (EMI) shield independent of the optical connector to cover a portion of the opening to reduce emissions of EMI radiation generated by the optical connector from the transceiver housing. According to another embodiment of the invention, a method comprising connecting an optical connecter to an optical port of a housing in an optical module, the housing comprising an opening to receive to the optical connector; and shielding a portion of an opening in the housing to reduce emissions of EMI radiation generated by the optical connector from the housing.

20 Claims, 6 Drawing Sheets

US 7,290,945 B2

ELECTROMAGNETIC INDUCTIVE SHIELD

FIELD

Embodiments of the invention relate to electromagnetic inductive (EMI) shields, and more particularly to a system and method for shielding optical modules from EMI emissions.

BACKGROUND

Optical communication, such as by fiber-optic cables, is in widespread use today. Optical communication allows for larger volumes of information to transmitted at faster velocities across a network with reduced occurrence of degradation of signal integrity, when compared to electrical communication using metallic conductors such as copper wires.

Though an effective form of transfer of information, optical communication is not without shortcomings. One such shortcoming is in the area of signal conversion from an optical signal to an electrical signal. This conversion is often necessary because currently, most of the devices which ultimately use the information carried by the optical signal, such as personal computers, operate by using electrical signals. To this end, optical modules such as transceiver are often used to convert optical signals into electrical signals, and vice versa.

Typically, a transceiver includes an optical port for receiving an optical connector of a fiber optics cable, and associated signal processing circuitry for converting optical signals received through fiber optics cable into electrical signals. The use of transceiver s, however, is not without shortcomings.

In some transceiver s, an opening in the transceiver housing which allows for an optical connector to be connected to the transceiver housing via an optical port is too large for certain class of optical connectors, resulting in the emission of the optical port's electromagnetic inductive (EMI) radiation from the opening. This emission or escaping of EMI radiation may cause interferences resulting in reduction or loss of integrity of the transmitted information. In addition, many transceiver housings include several optical ports for receiving multiple optical connectors. This scenario further exacerbates the effects of the EMI radiation as each optical connector can interfere with other optical connectors of the transceiver housing, and vice versa.

BRIEF DESCRIPTION OF THE DRAWINGS

Embodiments of the invention may best be understood by referring to the following description and accompanying drawings that are used to illustrate embodiments of the invention.

DETAILED DESCRIPTION

Embodiments of the invention generally relate to systems and methods for shielding optical modules from electromagnetic inductive (EMI) emissions. Herein, one embodiment of the invention may be applicable to optical modules for converting optical signals to electrical signals and vice versa, used in a variety of telecommunication devices, which are generally considered stationary or portable electronic devices. Examples of a telecommunication device may include, but are not limited or restricted to a computer, a set-top box, telephone systems, networking equipment, and the like.

Reference in the specification to the term "one embodiment of the invention" or "an embodiment of the invention" means that a particular feature, structure, or characteristic described in connection with the embodiment of the invention is included in at least one embodiment of the invention. The appearances of the phrase "in one embodiment of the invention" in various places in the specification are not necessarily all referring to the same embodiment of the invention. In the following description, numerous details are set forth. It will be apparent, however, to one skilled in the art, that the embodiments of the invention may be practiced without these specific details. In other instances, well-known structures and devices are shown in block diagram form, rather than in detail, in order to avoid obscuring the embodiments of the invention.

Also in the following description are certain terminologies used to describe features of the various embodiments of the invention. For example, the term "optical module" refers to a peripheral that converts optical signals to electrical signals (and vice versa) so as to create a link between systems that operate based on electrical signals, such as telecommunication devices, and optical medium such as fiber optics cables that transfer data at optical speeds, such as 10 giga-hertz (GHz). The term "Faraday cage" refers to an apparatus that substantially encloses a secondary apparatus and blocks outside electric fields and electromagnetic radiation from reaching the seconday apparatus so to protect the secondary apparatus. The cage may be made of an unbroken conducting material, like the metal box surrounding a sensitive radio receiver, or a wire mesh, like that in the door of a microwave oven.

Figure 1:
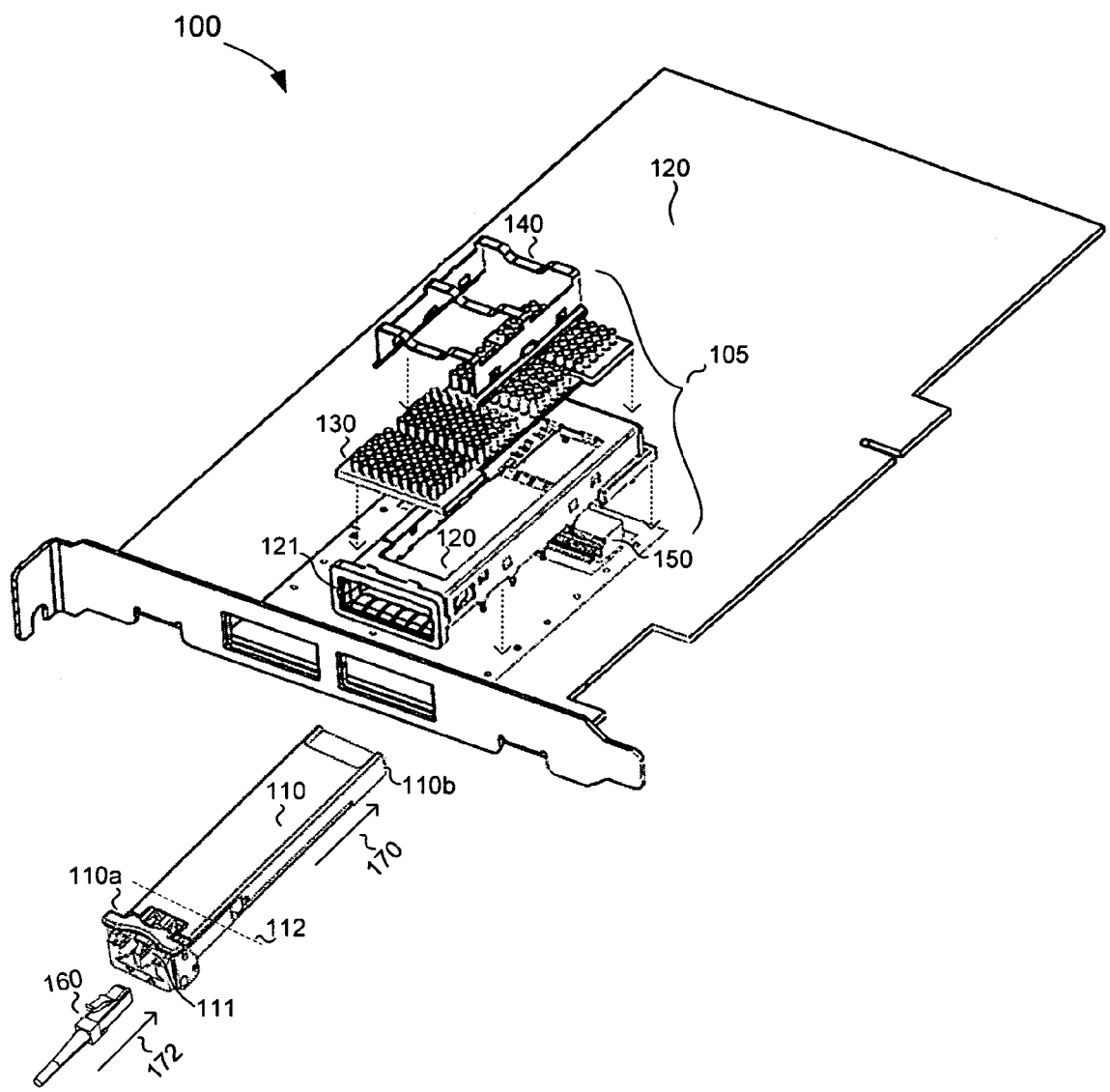
FIG. 1 is an exploded perspective view of an apparatus in which exemplary embodiments of the invention may be practiced.

FIG. 1 is an exploded perspective view of an exemplary portion of an apparatus 100 in which embodiments of the invention may be practiced. In an exemplary embodiment of the invention, the apparatus 100 is an optical module for converting optical signals into electrical signals and vice versa. As shown in FIG. 1, the apparatus 100 includes an enclosure assembly 105 (shown in exploded form) mounted on a printed circuit board assembly (PCBA) 120. The enclosure assembly 105 includes a clip 140, a heat sink 130, and a cage assembly 120 mounted on a connector 150. The cage assembly 120, such as a Faraday cage for example, receives a housing 110, such as a transceiver housing, a transmitter housing, or a receiver housing, via insertion into an opening 121 of the cage assembly 120, such as in the direction of the arrow 170 as shown in FIG. 1. Suitably the housing 110 is a transmitted housing 110 as used throughout the detailed description. The transceiver housing 110 includes at least one opening 111 through which an optical connector 160 is inserted, such as in the direction of the arrow 172, as described in greater detail in conjunction with FIGS. 2-4 below. The transceiver housing 110 is generally inserted into the cage assembly 120 up to approximately line 112 shown in FIG. 1, leaving the opening 111 exposed.

Figure 2:
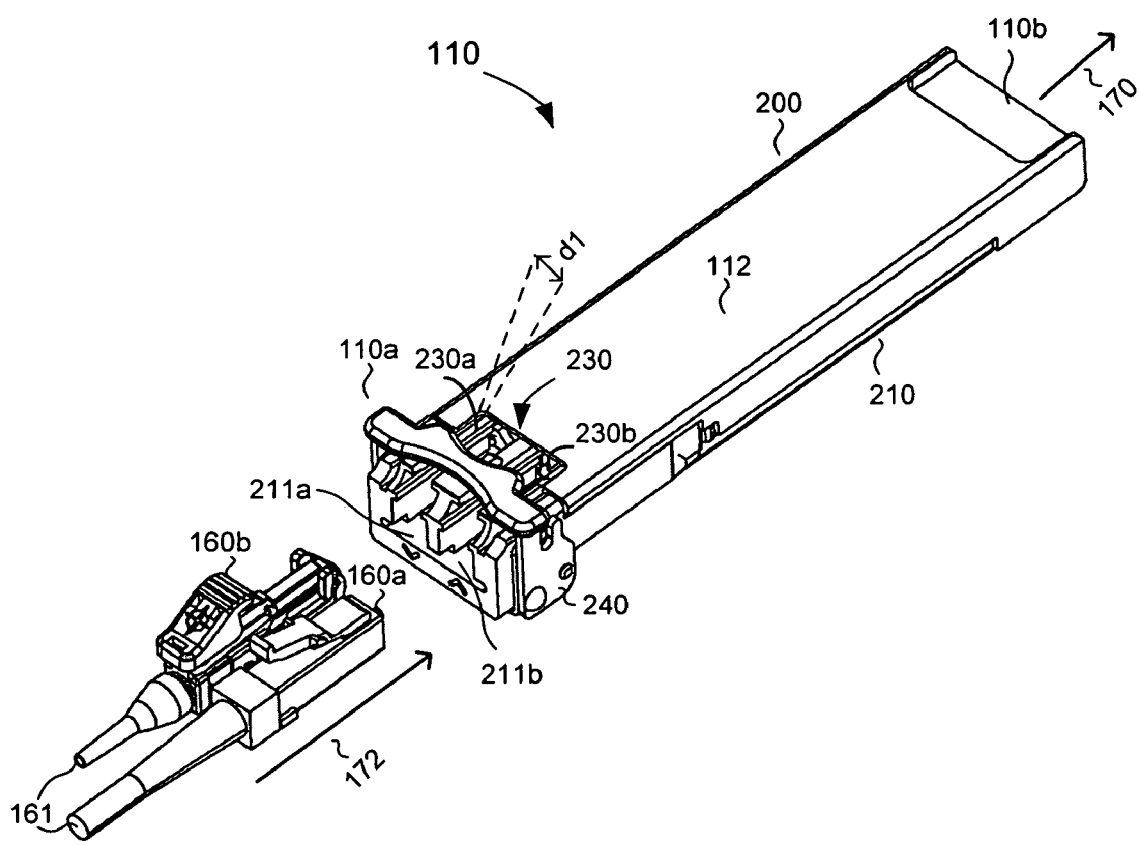
FIGS. 2-3 are additional perspective views of an apparatus in which exemplary embodiments of the invention may be practiced.

FIG. 2 is a perspective view of the transceiver housing 110 in which embodiments of the invention may be practiced. As shown in FIG. 2, the transceiver housing 110 includes a base cover portion 210, and a top cover portion 200 coupled to the base portion 210 that has a major external surface 112 with a thickness "d1", and a latch mechanism 240. In an exemplary embodiment of the invention, a portion of the opening 111, such as opening portion 230 is located on the external surface 112 on a proximal end portion 110a distal from the end portion 110b that is inserted first into the cage assembly 120. The opening portion 230 may include additional opening portions 230a and 230b.

The transceiver housing 110 also includes optical connector ports 211a and 211b, each capable of receiving (through the opening 111 of FIG. 1) optical connectors of different types, such as standard optical connector 160a, or a specialized optical connector 160b. The optical connectors 160a and 160b couple one or more optical medium 161, such as a fiber optics cables for example, to the transceiver housing 110. In an exemplary embodiment of the invention, standard optical connector 160a, such as a Lucent Connector, lacks shielding as part of the connector 160a, and thus may cause emissions of EMI radiation from the transceiver housing 110 through the opening portions 230a and 230b that are located in proximity of the optical connector ports 211a and 211b.

Figure 3:
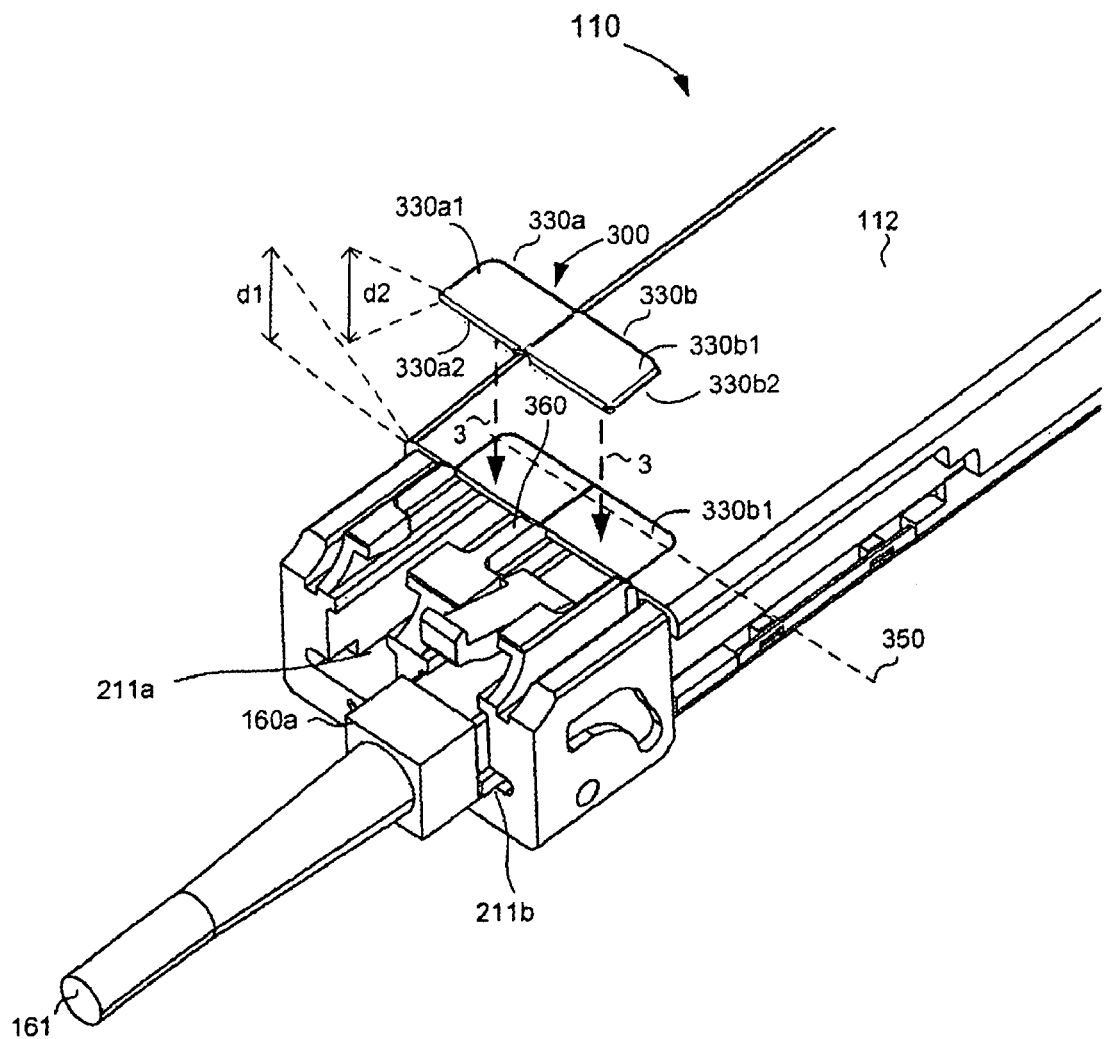

FIG. 3 is another perspective view of the transceiver housing 110 of FIG. 2 showing embodiments of the invention. As shown in FIG. 3, an exemplary embodiment of the invention includes an electromagnetic inductive (EMI) shield 330, such as EMI shields 330a and 330b for example, to cover portions of the opening 111, such as opening portions 230a and 230b, respectively. The EMI shield 330 is configured to reduce emissions of EMI radiation generated by the optical connector 160a from the transceiver housing 110. In an exemplary embodiment of the invention, the EMI shields 330a and 330b are independent of the optical connector 160a and are removable from the transceiver housing 110. As shown in FIG. 3, the EMI shields 330a and 330b are substantially co-extensive with the opening portions 230a and 230b, respectively, to substantially cover the opening portions 230a and 230b. It is contemplated that the EMI shield 300 may include a plurality of interlocking EMI shields, such as EMI shields 330a and 330b to cover portions of the opening portion 230, such as opening portions 230a and 230b, respectively, or a may be a single EMI shield 300 covering opening portion 230.

As shown in FIG. 3, each of the EMI shields 330a and 330b include a bottom portion facing the optical connector 160a, such as bottom portions 330a2 and 330b2, respectively, and a top portion, such as top portions 330a1 and 330b1, respectively, that are substantially coextensive with the bottom portions, 330a2 and 330b2, respectively. In an exemplary embodiment of the invention, the EMI shields 330a and 330b are of a "d2" thickness.

In an exemplary embodiment of the invention, one or more of the EMI shields 330a and 330b are of a metal-based composition, such as metallized plastic, sheet metal and die-cast zinc composition. In another exemplary embodiment of the invention, one or more of the EMI shields 330a and 330b are of a carbon-based composition, such as carbon-filled plastic and conductive plastic composition. EMI shields 330a and 330b may also be color-coded to match the optical wavelength of the apparatus 100 for ease of selecting an EMI-shield most effective for use with a particular apparatus 100.

FIGS. 4A-D are additional illustrations of exemplary embodiments of the EMI shield 300. For simplicity, a single EMI shield 300 is shown in FIGS. 4A-D covering the opening portion 230, although each EMI shield 300 shown may include a plurality of interlocking EMI shields, such as EMI shields 330a and 330b, to cover portions of the opening portion 230, such as opening portions 230a and 230b.

Figure 4A:
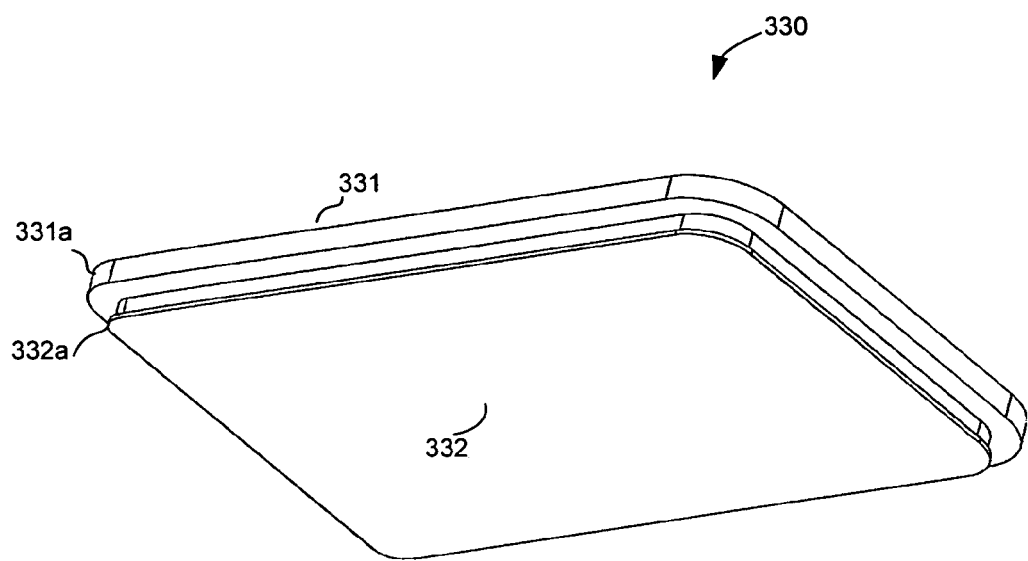
FIGS. 4A-D are additional views of the exemplary embodiments of the invention.
Figure 4B:
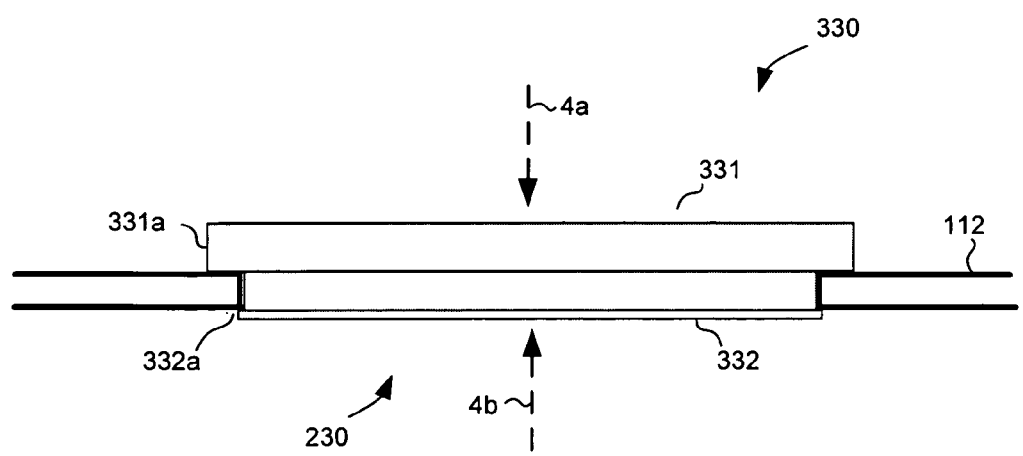

FIG. 4A is a perspective view of an exemplary embodiment of the EMI shield 300. As shown in FIG. 4A, the exemplary EMI shield 300 includes a top portion 331 and a bottom portion 332. The top portion includes a protruding flange portion 331a and the bottom portion includes a protruding flange portion 332a. As shown in FIG. 4B of a cross-sectional view of the major surface 112 taken along the line 350 (FIG. 3), the flange portions 331a and 332a are used for securing the EMI shield 330 to the major surface 112. First, a substantially downward vertical force is applied to the EMI shield 330, such as in the direction shown by arrow 4a, which causes the EMI shield 330 to slightly flex to allow passage of the flange portions 332a through opening 230. Following the passage of the flange portion 332a through opening 230, the EMI shield 330 reverts back to its original shape so to "snap" into place. The flange portions 331a and 332a then restrict the movement of the EMI shield 300 to hold the EMI shield 330 in place as shown in FIG. 4B. The EMI shield 330 can also be thereafter removed by applying a upward vertical force to the EMI shield 330, such as in the direction shown by arrow 4b, which causes the EMI shield 330 to slightly flex to allow passage of the flange portion 332a through opening 230, so as to "unsnap" the EMI shield 330 out of the opening 230. Suitably, the EMI shield 330 is of composition sufficiently flexible to allow the EMI shield 330 to slightly flex to allow passage of the flange portions 332a through opening 230.

Figure 4C:
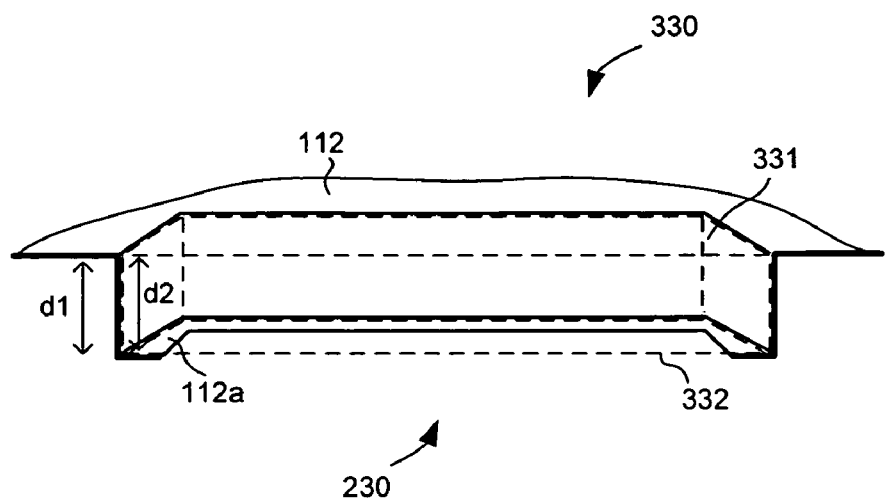

FIG. 4C is a cross-sectional view (taken along the line 350 in FIG. 3) of another exemplary embodiment of the EMI shield 300 inserted into the opening 230. As shown in FIG. 4C, the opening 230 includes an edge portion 112a which allows for the bottom portion 332 of the EMI shield 300 to rest on the edge portion 112a. The EMI shield 300 is substantially co-extensive with the opening 230 so that friction forces between the boundaries of the EMI shield 300 and the opening 230 can hold the EMI shield 300 in place. Suitably, the EMI shield 300 is of a "d2" thickness that is substantially the same as the thickness "d1" of the major surface 112 so that the top portion 331 the EMI-shield 330 is substantially co-planar (i.e. flush) with the major surface 112.

Figure 4D:
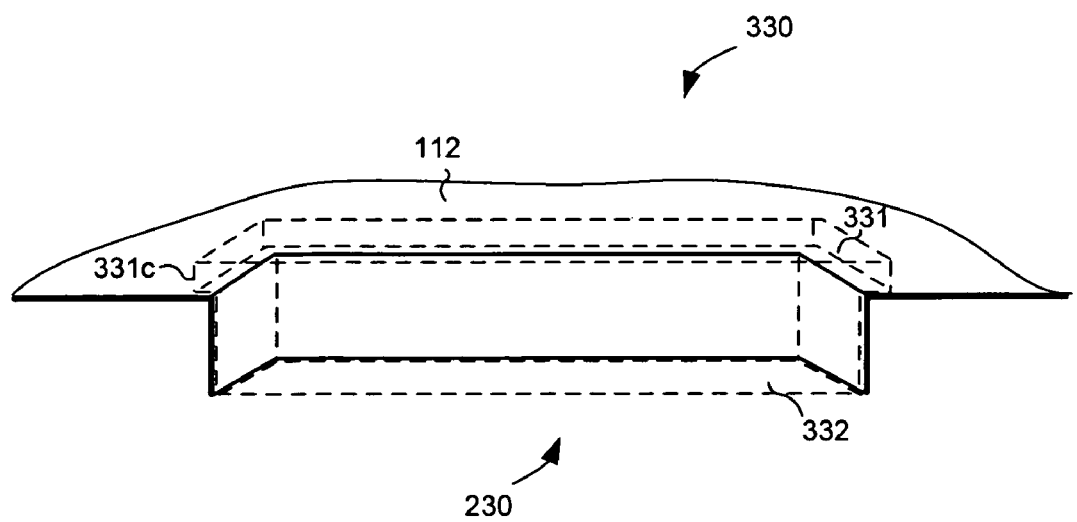

FIG. 4D is another cross-sectional view (taken along the line 350 in FIG. 3) of another exemplary embodiment of the EMI shield 300 inserted into the opening 230. As shown in FIG. 4D, the exemplary EMI shield 300 includes a top portion 331 which has a flange portion 331c. The flange portion 331c allows for the EMI shield 300 to rest on the major surface 112 substantially co-extensive with the opening 230. Suitably, the bottom portion 332 of the EMI shield 300 is substantially co-extensive with the opening 230 so that friction forces between the boundaries of the EMI shield 330 and the opening 230 can hold the EMI shield 300 in place.

Figure 5:
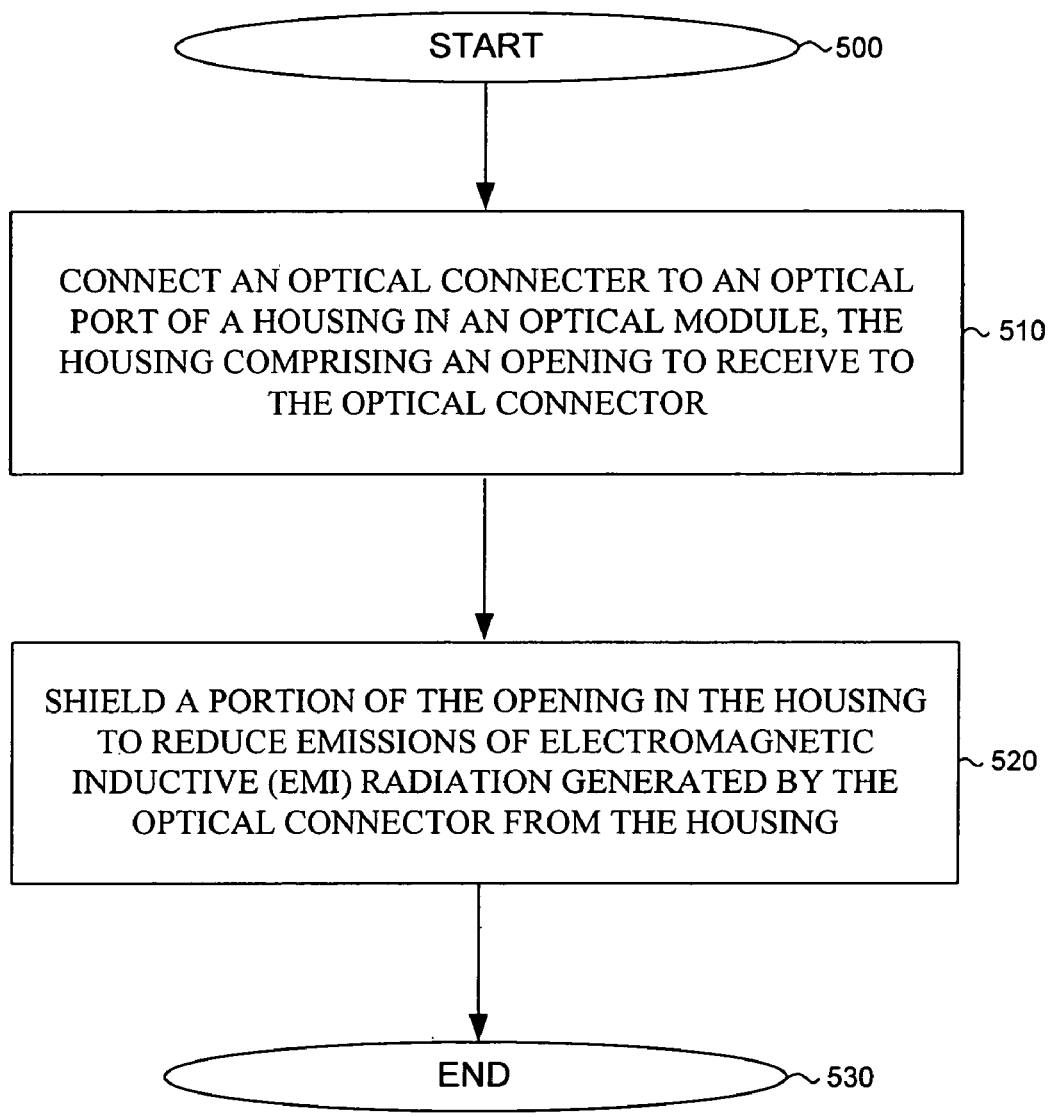
FIG. 5 is a flow chart illustrating an exemplary process according to an exemplary embodiment of the invention.

FIG. 5 is an exemplary flow chart, which in conjunction with FIGS. 1-4D, illustrates an exemplary process according to an embodiment of the invention. As shown in FIG. 5, following start (block 500), an optical connecter 160a, is connected to the transceiver housing 110 via an optical port 211b through an opening 111 (block 510). Next, a portion of the opening 111 in the transceiver housing 110, such as opening portions 230a and 230b (FIG. 2), are shielded (block 520). As shown in FIG. 3, removable EMI shields 330a and 330b are placed in the opening portions 230a and 230b, respectively, such as in the direction of the arrows 3, to reduce the escaping of EMI radiation emanating from the optical connector 165a from the transceiver housing 110 through the opening portions 230a and 230b. Suitably, an EMI shield is selected which corresponds to an optical wavelength of the optical module, such as based on a coding of the EMI shield, such as a color-coding. Referring to FIG. 5, following the shielding operations, the optical module is ready to operate with reduced EMI radiation emission. The flow then ends (block 530).

For simplicity, the apparatus 100 in FIG. 1 is shown supporting a single transceiver housing 110 with a pair of connector ports 211a and 211b (shown in FIG. 2), although apparatus 100 may support multiple transceiver housings 110, each having a one or more connector ports. It should be noted that the various features of the foregoing embodiments of the invention were discussed separately for clarity of description only and they can be incorporated in whole or in part into a single embodiment of the invention having all or some of these features.

What is claimed is:

1. A system comprising:
   a housing including a top cover portion having an opening located at an end of the top cover portion, the opening to receive an optical connector; and
   an electromagnetic inductive (EMI) shield independent of the optical connector to cover a portion of the opening being planar with the top cover portion to reduce emissions of EMI radiation generated by the optical connector from the transceiver housing.

2. The system of claim 1, wherein the housing a first end-portion adapted to receive the optical connector and a second end-portion distal from the first end-portion wherein the opening is on the first end-portion.

3. The system of claim 1, wherein the housing further comprises:
   a base cover portion;
   a top cover portion coupled to the base portion and having a major external surface with a thickness d1, the portion of the opening located on the major external surface; and
   at least one optical connector port to receive the optical connector through the opening, the portion of the opening located in proximity of the optical connector port.

4. The system of claim 3, wherein the EMI shield is of a d2 thickness.

5. The system of claim 3, wherein the EMI shield comprises a bottom portion and a top portion, the bottom portion to face the optical connector port and substantially coextensive with the top portion.

6. The system of claim 5 wherein the top portion comprises a flange portion.

7. The system of claim 5 wherein the bottom portion comprises a flange portion.

8. The system of claim 1, wherein the EMI shield is substantially co-extensive with the portion of the opening.

9. The system of claim 1, wherein the EMI shield is a removable EMI shield.

10. The system of claim 1, wherein the EMI shield is of a metal-based composition.

11. The system of claim 10, wherein the EMI shield is of at least one of a metallized plastic and die-cast zinc composition.

12. The system of claim 1, wherein the EMI shield is of a carbon-based composition.

13. The system of claim 12, wherein the EMI shield is of at least one of a carbon-filled plastic and conductive plastic composition.

14. The system of claim 1, wherein the optical connector connects an optical medium to the transceiver housing.

15. An apparatus comprising:
   an enclosure assembly mounted on a printed circuit board assembly of an optical module, the enclosure assembly to receive a housing including an opening located at an end portion of the housing and a top portion of the opening being planar to a top cover portion of the housing so as to receive an optical connector inserted into the opening; and
   an electromagnetic inductive (EMI) shield independent of the optical connector to cover the top portion of the opening to reduce emissions of EMI radiation generated by the optical connector from the transceiver housing.

16. The apparatus of claim 15, wherein the enclosure assembly comprises a Faraday cage assembly.

17. The apparatus of claim 15, wherein the optical module converts optical signals into electrical signals.

18. A method comprising:
   connecting an optical connecter to an optical port of a housing in an optical module, the housing comprising an opening to receive to the optical connector prior to connecting with the optical port; and
   shielding a top cut-out portion of the opening in the housing that is planar with a top cover portion of the housing to reduce emissions of electromagnetic inductive (EMI) radiation generated by the optical connector from the transceiver housing.

19. The method of claim 18, the shielding a portion of an opening comprising:
   removably shielding the portion of the opening in the transceiver housing.

20. The method of claim 18, the shielding a portion of an opening comprising:
   selecting a shield corresponding to an optical wavelength of the optical module.

* * * * *